(12) United States Patent
Shibata et al.

(10) Patent No.: US 8,450,911 B2
(45) Date of Patent: May 28, 2013

(54) PIEZOELECTRIC THIN FILM HAVING A HIGH PIEZOELECTRIC CONSTANT AND A LOW LEAK CURRENT

(75) Inventors: Kenji Shibata, Tsukuba (JP); Kazufumi Suenaga, Tsuchiura (JP); Akira Nomoto, Kasumigaura (JP); Kazutoshi Watanabe, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 427 days.

(21) Appl. No.: 12/948,083

(22) Filed: Nov. 17, 2010

(65) Prior Publication Data
US 2011/0121690 A1    May 26, 2011

(30) Foreign Application Priority Data
Nov. 20, 2009  (JP) ................. 2009-265466

(51) Int. Cl.
*H01L 41/187* (2006.01)
(52) U.S. Cl.
USPC ........ 310/358; 252/62.9 R; 501/134; 501/135
(58) Field of Classification Search
CPC .................................. H01L 41/1873
USPC ................. 310/358; 252/62.9 R; 501/134, 501/135
See application file for complete search history.

(56) References Cited

U.S. PATENT DOCUMENTS

| | | | |
|---|---|---|---|
| 7,332,851 B2 * | 2/2008 | Nanataki et al. | 310/358 |
| 7,352,113 B2 * | 4/2008 | Nagaya et al. | 310/358 |
| 7,482,736 B2 * | 1/2009 | Ueno et al. | 310/358 |
| 7,538,476 B2 * | 5/2009 | Chrysler et al. | 310/363 |
| 7,560,089 B2 * | 7/2009 | Takao et al. | 423/594.7 |
| 7,576,477 B2 * | 8/2009 | Koizumi et al. | 310/365 |
| 8,004,163 B2 * | 8/2011 | Shibata et al. | 310/358 |
| 8,084,925 B2 * | 12/2011 | Shibata et al. | 310/358 |
| 8,232,708 B2 * | 7/2012 | Shibata et al. | 310/358 |
| 8,316,519 B2 * | 11/2012 | Kimura et al. | 29/25.35 |
| 2004/0127344 A1 * | 7/2004 | Sato et al. | 501/134 |
| 2007/0126313 A1 | 6/2007 | Ueno et al. | |

(Continued)

FOREIGN PATENT DOCUMENTS

| JP | 2007184513 A | 7/2007 |
|---|---|---|
| JP | 2008159807 A | 7/2008 |

OTHER PUBLICATIONS

K. Shibata et al., Piezoelectric Properties of (K,Na)NbO3 Films Deposited by RF Magnetron Sputtering, Applied Physics Express, 1 (2008), 011501.*
T. Saito et al., Pulsed Laser Deposition of High-Quality (K,Na)NbO3 Thin Films on SrTiO3 Substrate Using High-Density Ceramic Targets, Jpn, J. Appl. Phys, 43 (2004) 6627.*
T. Mino et al., Piezoelectric Properties of Epitaxial NaNbO3 Thin Films Deposited on (001) SrRuO3/Pt/MgO Substrates, Japanese Journal of Applied Physics, vol. 46 (2007) 6960.*

*Primary Examiner* — J. San Martin
(74) *Attorney, Agent, or Firm* — Marty Fleit; Paul D. Bianco; Fleit Gibbons Gutman Bongini & Bianco PL

(57) ABSTRACT

To provide a piezoelectric thin film element comprising: a piezoelectric thin film on a substrate, having an alkali-niobium oxide-based perovskite structure expressed by a composition formula $(K_{1-x}Na_x)_yNbO_3$, wherein composition ratios x, y of the piezoelectric thin film expressed by $(K_{1-x}Na_x)_yNbO_3$ are in a range of $0.4 \leq x \leq 0.7$ and $0.7 \leq y \leq 0.94$.

12 Claims, 4 Drawing Sheets

U.S. PATENT DOCUMENTS

| | | | |
|---|---|---|---|
| 2007/0271750 A1* | 11/2007 | Hamada et al. | 29/25.01 |
| 2008/0308762 A1* | 12/2008 | Ueno et al. | 252/62.9 R |
| 2009/0075066 A1* | 3/2009 | Shibata et al. | 428/332 |
| 2009/0096328 A1* | 4/2009 | Shibata et al. | 310/346 |
| 2009/0236944 A1 | 9/2009 | Shibata et al. | |
| 2010/0013894 A1* | 1/2010 | Ueno et al. | 347/72 |
| 2011/0175488 A1* | 7/2011 | Shibata et al. | 310/319 |
| 2012/0056508 A1* | 3/2012 | Horikiri et al. | 310/317 |
| 2012/0304429 A1* | 12/2012 | Horikiri et al. | 29/25.35 |
| 2013/0009519 A1* | 1/2013 | Shibata et al. | 310/348 |

\* cited by examiner

PIEZOELECTRIC THIN FILM HAVING A HIGH PIEZOELECTRIC CONSTANT AND A LOW LEAK CURRENT

The present application is based on Japanese Patent Application No. 2009-265466, filed on Nov. 20, 2009, the entire contents of which are hereby incorporated by reference.

BACKGROUND OF THE INVENTION

1. Field of the Invention

The present invention relates to a piezoelectric thin film element and a piezoelectric thin film device, using a piezoelectric thin film of alkali-niobium oxide series.

2. Description of the Related Art

A piezoelectric ceramics is processed into various piezoelectric elements in accordance with various purposes, and is widely used particularly as a functional electronic component such as an actuator for generating deformation by adding a voltage to the piezoelectric elements, and a sensor for detecting the voltage generated by deformation of the piezoelectric elements. As the piezoelectric ceramics used for the purpose of use of the actuator and the sensor, a dielectric material, being a lead-based material, having excellent piezoelectric characteristics, and particularly a PZT-based perovskite-type ferroelectric ceramics expressed by a composition formula: $Pb(Zr_{1-x}Ti_{x-1})O_3$ is widely known heretofore. PZT-based piezoelectric ceramics is ordinarily formed by sintering an oxide of each of the constituents. With a progress of miniaturization and high performance of each kind of electronic component, the miniaturization and high performance of the piezoelectric elements are also strongly requested.

However, in a piezoelectric material fabricated by a sintering method, being a conventional method, as a thickness thereof becomes smaller, particularly as the thickness becomes nearly about 10 μm, a thickness of the piezoelectric thin film corresponds to almost a size of each crystal grain constituting the thin film, and an influence on the piezoelectric characteristics, etc, can not be ignored. Therefore, there is a problem that variation or deterioration of characteristics is remarkable. Therefore, in order to prevent such a problem, a forming method of the piezoelectric ceramics using a thin film technique instead of the sintering method, has been studied in recent years. Recently, a PZT thin film formed on a silicon substrate by sputtering has been put to practical use as a piezoelectric thin film of an actuator for an ink jet printer head with high-speed and high-definition.

Meanwhile, a piezoelectric sintered ceramics or a piezoelectric thin film made of PZT contains lead by about 60 to 70 wt %, and therefore is not preferable in terms of an ecological viewpoint and pollution control. Therefore, in consideration of an environment, development of the piezoelectric ceramics not containing lead is desired. At present, various non-lead piezoelectric materials are studied, including potassium sodium niobate (also described as "KNN" hereafter) expressed by a composition formula $(K_{1-x}Na_x)NbO_3 (0<x<1)$, composed of K (potassium), Na (sodium), Nb (niobium), and O (oxygen) (for example, see patent document 1 and patent document 2). The KNN is a material having a perovskite structure and shows relatively excellent piezoelectric characteristics for a non-lead (lead-free) material, and therefore is expected as a strong candidate of a non-lead (lead-free) piezoelectric material.

(Patent Document 1)
Japanese Patent Laid Open Publication No. 2007-184513
(Patent Document 2)
Japanese Patent Laid Open Publication No. 2008-159807

A KNN thin film is formed on a silicon substrate by a film formation method such as sputtering, Sol-Gel method, and aerosol deposition, and there is a report that a piezoelectric constant $d_{31}=-100$ pm/V, being characteristics of a practical level, can be obtained. However, a method for realizing the KNN thin film having excellent piezoelectric characteristics stably has not been established, and at present, application to a practical use is difficult. In order to widely apply the KNN thin film to an ink jet printer head, etc, at least the piezoelectric constant $d_{31}$ of $-90$ pm/V or more, preferably $-100$ pm/V or more needs to be stably realized. (In this specification, in a case of the piezoelectric constant $d_{31}$, being a negative value, $-90$ [pm/V] or more of the piezoelectric constant $d_{31}$ means that the piezoelectric constant $d_{31}$ takes values such as $-90$, $-100$, $-110$ [pm/V], etc, namely, an absolute value $|d_{31}|$ is 90 [pm/V] or more.)

BRIEF SUMMARY OF THE INVENTION

An object of the present invention is to provide a piezoelectric thin film element using a piezoelectric thin film of alkali-niobium oxide series having piezoelectric characteristics which can be substituted for the present PZT thin film, and a piezoelectric thin film device using the piezoelectric thin film element.

According to an aspect of the present invention, a piezoelectric thin film element is provided, comprising:

a piezoelectric thin film on a substrate, having an alkali-niobium oxide-based perovskite structure expressed by a composition formula $(K_{1-x}Na_x)_yNbO_3$, wherein composition ratios x, y of the piezoelectric thin film expressed by $(K_{1-x}Na_x)_yNbO_3$ are in a range of $0.4 \leq x \leq 0.7$ and $0.7 \leq y \leq 0.94$.

According to other aspect of the present invention, the piezoelectric thin film element is provided, comprising:

the piezoelectric thin film on a substrate, having the alkali-niobium oxide-based perovskite structure expressed by a composition formula $(K_{1-x}Na_x)_yNbO_3$, wherein composition ratios x, y of the piezoelectric thin film expressed by $(K_{1-x}Na_x)_yNbO_3$ are in a range of $0.4 \leq x \leq 0.7$ and $0.75 \leq y \leq 0.90$.

According to another aspect of the present invention, a piezoelectric thin film device is provided, comprising:

the piezoelectric thin film element described in the aforementioned aspect;

a lower electrode on the substrate side of the piezoelectric thin film;

an upper electrode on the opposite side to the substrate of the piezoelectric thin film; and a voltage application unit or a voltage detection unit connected between the lower electrode and the upper electrode.

DETAILED DESCRIPTION OF THE INVENTION

An embodiment of a piezoelectric thin film element and an embodiment of a piezoelectric thin film device using the piezoelectric thin film element according to an embodiment of the present invention will be described hereafter.

[Piezoelectric Thin Film Element According to an Embodiment]

Figure 1:
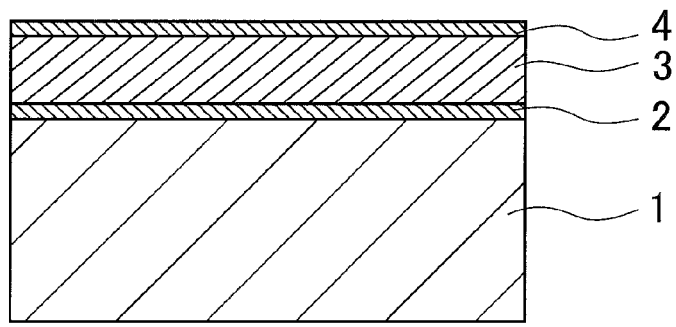
FIG. 1 is a cross-sectional view showing a structure of a piezoelectric thin film element according to an embodiment of the present invention.

FIG. 1 is a cross-sectional view showing a schematic structure of a piezoelectric thin film element according to an embodiment of the present invention. As shown in FIG. 1, the piezoelectric thin film element has a structure in which lower electrode 2, piezoelectric thin film 3, and upper electrode 4 are sequentially formed on substrate 1.

As the substrate 1, Si (silicon) substrate, Si substrate with a surface oxide film having an oxide film on a surface of the Si substrate, or SOI (Silicon On Insulator) substrate is preferably used. As the Si substrate, for example (100) plane Si substrate is used, with a surface of the Si substrate oriented to (100) plane direction. However, the Si substrate with plan direction different from (100) plane may also be used. Further, as the substrate 1, a quartz glass substrate, a GaAs substrate, a sapphire substrate, and a metal substrate such as a stainless substrate, a MgO substrate, and a $SrTiO_3$ substrate, etc, may also be used.

The lower electrode 2 is made of Pt (platinum), and Pt electrode with Pt film preferentially oriented to (111) plane direction is preferable. The Pt film formed on the Si substrate is easily oriented to (111) plane direction, due to self-orientation tendency. The lower electrode 2 may be an electrode using an alloy containing Pt, Au (gold), Ru (ruthenium), Ir (iridium), or a metal oxide such as $SrRuO_3$, $LaNiO_3$, other than Pt. The lower electrode 2 is formed by using sputtering or vapor deposition, etc. Note that an adhesive layer may also be formed between the substrate 1 and the lower electrode 2, to enhance adhesiveness of the lower electrode 2.

The piezoelectric thin film 3 has an alkali niobium oxide-based perovskite structure expressed by a composition formula $(K_{1-x}Na_x)_yNbO_3$ (abbreviated as "KNN" hereafter), composition ratio (coefficient) x=Na/(K+Na), and composition ratio (composition ratios) y=(K+Na)/Nb are in a range of $0.4 \leq x \leq 0.7$ and $0.7 \leq y \leq 0.94$. Further, KNN thin film, with composition ratios x, y set in a range of $0.4 \leq x \leq 0.7$ and $0.75 \leq y \leq 0.90$, is more preferably used as the piezoelectric thin film 3. A formation method of the piezoelectric thin film 3, being the KNN thin film, includes sputtering, CVD (Chemical Vapor Deposition), PLD (Pulsed Laser Deposition), and a Sol-Gel method, and so forth.

Similarly to the lower electrode 2, the upper electrode 4 is made of Pt and Au, and may be formed by using sputtering, vapor deposition, plating, and a metal paste method, etc. The upper electrode 4 does not give a great influence on a crystal structure of the piezoelectric thin film 3, like the lower electrode 2, and therefore a material of the upper electrode 4 is not particularly limited.

Incidentally, conventionally the piezoelectric thin film made of KNN film is ordinarily formed by sputtering using a target having a composition ratio y=1 in $(K_{1-x}Na_x)_yNbO_3$, being a stoichiometric composition $(K_{1-x}Na_x)_yNbO_3$, and the KNN film having a composition in the vicinity of y=1 is manufactured and studied (for example, see non-patent document 1 and non-patent document 2 described below).

Non-Patent Document 1: K. Shibata, F. Oka, A. Ohishi, T. Mishima, and I. Kanno, Applied Physics Express, 1 (2008), 011501.

Non-Patent Document 2: T. Saito, T. Wada, H. Adachi, and I. Kanno, Jpn. J. Appl. Phys, 43 (2004), 6627.

This time, when the KNN film with coefficient y smaller than 1 is purposefully formed, namely, when the KNN film with smaller K and Na than those of the KNN film $((K_{1-x}Na_x)NbO_3)$ of the stoichiometric composition with y=1 is formed, it is found that the piezoelectric constant is larger than that of the KNN film in the vicinity of y=1. Although details of a mechanism of improving the piezoelectric constant is not clear, it can be estimated that by setting y smaller than 1, moderate destabilizing factor is introduced to the KNN film with y=1, which is ideal as a crystal, thus easily allowing expansion/contraction of a crystal lattice (piezoelectric operation) to occur by the electric field.

Various KNN films with different coefficients x, y of $(K_{1-x}Na_x)_yNbO_3$ are fabricated, and their structure and piezoelectric characteristics are examined (see table 1 in an example as described later). As a result, it is found that the KNN thin film has a perovskite-type pseudo-cubic crystal structure, and is preferentially oriented to (001) plane direction, and in a case of satisfying $0.4 \leq x \leq 0.7$, has a high piezoelectric constant $d_{31}$ (−90 pm/V or more, a practical level) at the time of satisfying a range of $0.70 \leq y \leq 0.94$ (see table 1 of the example and FIG. 7). Further, it is also found that the KNN thin film has a further high piezoelectric constant $d_{31}$ (−100 pm/V or more, a practical level) when satisfying a range of $0.4 \leq x \leq 0.7$ and $0.75 \leq y \leq 0.90$ (see table 1 of the example and FIG. 7).

Figure 8:
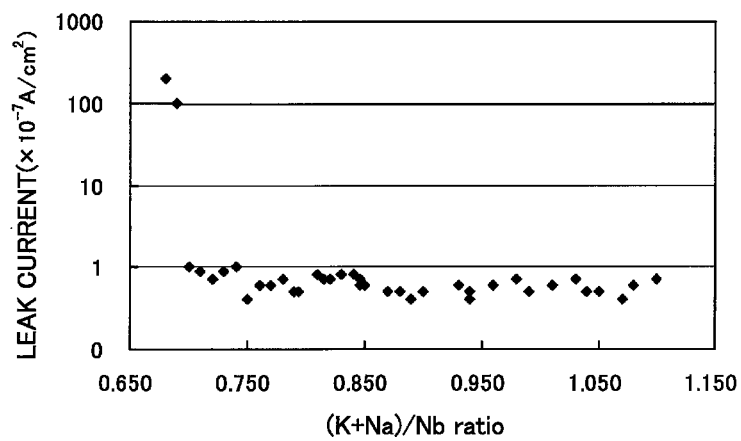
FIG. 8 shows a graph showing a relation between a leak current at the time of applying an electric field of 50 kV/cm to the piezoelectric thin film element, and the ratio (K+Na)/Nb of KNN piezoelectric thin films according to examples of the present invention and comparative examples.

Further, it is also found that in a case of y<0.7, insulating performance of the KNN thin film is remarkably deteriorated, and different order of magnitude more leak current is increased, and therefore the KNN thin film is hardly used as the piezoelectric thin film element (see table 1 of the example and FIG. 8).

Thus, a remarkable increase of the leak current occurs in a case that (K+Na)/Nb, being y, is smaller than 0.7, and the reason can be considered as follows. In a case that (K+Na)/Nb ratio is 1, an ideal composition (stoichiometric composition) is obtained when the KNN thin film is considered as a crystal. When (K+Na)/Nb ratio is smaller than 1, Nb, being a constituent of site B (a body center site of the crystal lattice) is included in site A (vertex sites of the crystal lattice) in which K and Na are originally included. Even in a case of Nb-rich, Nb is settled in the site A. However, Nb is included interstitial sites when the composition exceeds a certain critical composition. It can be considered that Nb included interstitial sites works as a carrier for carrying electric charge, thereby causing the insulating performance to deteriorate at once.

A method of manufacturing the KNN thin film in a range of $0.4 \leq x \leq 0.7$, and $0.70 \leq y \leq 0.94$ or $0.75 \leq y \leq 0.90$, includes a method of performing sputtering by using a target with smaller K and Na compared with the stoichiometric composition, namely with y smaller than 1 (see table 1). Further, even when using the target, with y set in the vicinity of y=1, the KNN thin film with a composition of $0.70 \leq y \leq 0.94$ or $0.75 \leq y \leq 0.90$ can also be fabricated by setting a substrate temperature for depositing a film by sputtering, to be a higher temperature (for example 800° C.) than a generally used temperature (500 to 700° C.) (see table 1).

[Piezoelectric Thin Film Element According to Other Embodiment]

Figure 2:
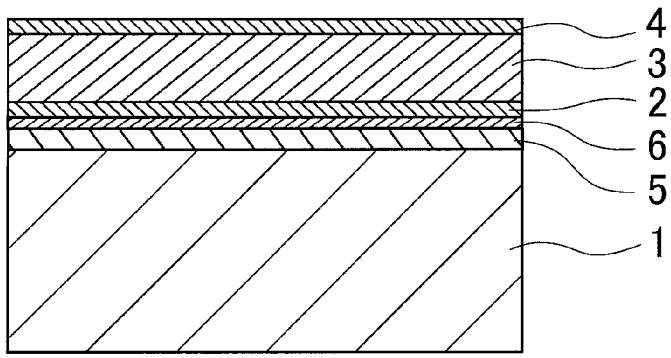
FIG. 2 is a cross-sectional view showing a structure of the piezoelectric thin film element according to other embodiment of the present invention.

FIG. 2 shows a schematic cross-sectional structure of the piezoelectric thin film element according to other embodiment of the present invention. Similarly to the piezoelectric thin film element of the aforementioned embodiment shown in FIG. 1, this piezoelectric thin film element has the lower electrode 2, the piezoelectric thin film 3, and the upper electrode 4 on the substrate 1. However, as shown in FIG. 2, the substrate 1 is a substrate with a surface oxide film wherein an oxide film 5 is formed on its surface, and an adhesive layer 6 is provided between the oxide film 5 and the lower electrode 2, to increase adhesiveness of the lower electrode 2.

The substrate 1 with oxide film is for example a Si substrate with oxide film, and in the Si substrate with oxide film, $SiO_2$ film formed by thermal oxidization and Si oxide film formed by CVD can be given as the oxide film 5. Further, Ti (titanium) and Ta (tantalum), etc, are used for the adhesive layer 6, and the adhesive layer 6 is formed by sputtering, etc.

Note that the piezoelectric thin film 3 of the piezoelectric thin film element according to the aforementioned embodiments are the KNN thin film of a single layer. However, multiple layers of the KNN thin film may also be acceptable, in a range of $0.4 \leq x \leq 0.7$, and $0.70 \leq y \leq 0.94$ or $0.75 \leq y \leq 0.90$. Further, constituents other than K (potassium), Na (sodium), Nb (niobium), O (oxygen), for example, 5 atoms % or less of Li (lithium), Ta (tantalum), Sb (antimony), Ca (calcium), Cu (copper), Ba (barium), Ti (titanium), etc, may be added to the piezoelectric thin film 3 of KNN, and in this case as well, similar effects can be obtained. Further, in addition to the KNN thin film in a range of $0.4 \leq x \leq 0.7$, and $0.70 \leq y \leq 0.94$ or $0.75 \leq y = 0.90$, for example the KNN thin film of a composition in the vicinity of y=1, or a thin film made of alkali niobate oxide-based material other than KNN, or materials having the perovskite structure ($LaNiO_3$, $SrTiO_3$, $LaAlO_3$, $YAlO_3$, $BaZrO_3$, $BaSnO_3$, $BaMnO_3$, etc) may be included between the lower electrode 2 and the upper electrode 4.

[Piezoelectric Thin Film Device Using the Piezoelectric Thin Film Element]

Figure 3:
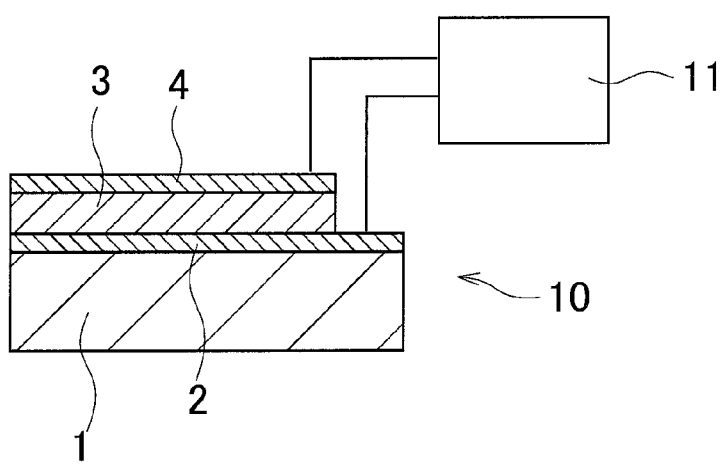
FIG. 3 is a configuration diagram showing an embodiment of a piezoelectric thin film device manufactured by using the piezoelectric thin film element according to an embodiment of the present invention.

FIG. 3 shows a configuration diagram of a piezoelectric thin film device fabricated by using the piezoelectric thin film element according to an embodiment of the present invention. As shown in FIG. 3, in the piezoelectric thin film device, at least a voltage detection unit or voltage application unit 11 is connected between the lower electrode 2 and the upper electrode 4 of the piezoelectric thin film element 10 molded into a prescribed shape.

By connecting the voltage detecting unit 11 between the lower electrode 2 and the upper electrode 4, a sensor as the piezoelectric thin film device, can be obtained. When the piezoelectric thin film element 10 of the sensor is deformed with a change of a certain physical quantity, a voltage is generated by this deformation, and therefore by detecting the voltage by the voltage detection unit 11, each kind of physical quantity can be measured. For example, a gyroscope, an ultrasonic sensor, a pressure sensor, a speed sensor, an acceleration sensor, etc, can be given as the sensor.

Further, by connecting the voltage application unit 11 between the lower electrode 2 and the upper electrode 4 of the piezoelectric thin film element 10, an actuator, being the piezoelectric thin film device, can be obtained. Each kind of member can be operated by applying voltage to the piezoelectric thin film element 10 of the actuator and deforming the piezoelectric thin film element 10. The actuator can be used, for example, in an inkjet printer, a scanner, and an ultrasonic wave generator, etc.

Note that the piezoelectric thin film element of the present invention can be applied to a surface acoustic wave device, etc.

EXAMPLES

Next, examples of the present invention will be described.

The piezoelectric thin film element of the examples and comparative examples has a cross-sectional structure similar to the embodiment shown in FIG. 2, and Ti adhesive layer, Pt lower electrode, KNN piezoelectric thin film, and Pt upper electrode are laminated on the Si substrate having a thermal oxide film.

[Film Deposition of the KNN Piezoelectric Thin Film]

A film deposition method of the KNN piezoelectric thin film according to examples and comparative examples will be described hereafter.

Si substrate with thermal oxide film was used as the substrate ((100) plane orientation, thickness: 0.525 mm, size: 20 mm×20 mm, thickness of the thermal oxide film: 200 nm). First, Ti adhesive layer (film thickness: 2 nm) and Pt lower electrode ((111) plane preferential orientation, film thickness: 200 nm) were formed on the substrate by RF magnetron sputtering. The Ti adhesive layer and the Pt lower electrode were formed under conditions of a substrate temperature: 300° C., discharge power: 200 W, introduction gas: Ar, pressure of Ar atmosphere: 2.5 Pa, film deposition time: 1-3 minutes for the Ti adhesive layer, and 10 minutes for the Pt lower electrode.

Subsequently, 3 μm of $(K_{1-x}Na_x)_yNbO_3$ thin film was formed on the Pt lower electrode by RF magnetron sputtering. $(K_{1-x}Na_x)_yNbO_3$ piezoelectric thin film was formed by using a $(K_{1-x}Na_x)_yNbO_3$ sintered ceramics with ratio (K+Na)/Nb=0.812 to 1.282, ratio Na/(K+Na)=0.41 to 0.72, under conditions of substrate temperature: 650° C., 700° C., or 800° C., discharge power: 100 W, introduction gas: Ar, and pressure of the Ar atmosphere: 1.3 Pa. A target of the $(K_{1-x}Na_x)_yNbO_3$ sintered ceramics was fabricated by using raw materials of $K_2CO_3$ powder, $Na_2CO_3$ powder, $Nb_2O_5$ powder, grinding and mixing these raw materials for 24 hours by using a ball mill, and preliminarily sintering them at 850° C. for 10 hours, thereafter grinding the raw materials again by the ball mill, and molding the raw materials under pressure of 200 MPa, and thereafter sintering them at 1080° C. The ratio (K+Na)/Nb and the ratio Na/(K+Na) were controlled by adjusting a mixing ratio of the $K_2CO_3$ powder, $Na_2CO_3$ powder, and $Nb_2O_5$ powder. Regarding the fabricated target, the percentage of the number of atoms of K, Na, and Nb was measured by EDX (Energy Dispersive X-ray Spectroscopy) before using the film deposition by sputtering, and each ratio (K+Na)/Nb and Na/(K+Na) was calculated. The ratio (K+Na)/Nb, the ratio Na/(K+Na), and the film deposition temperature by sputtering (substrate temperature) are shown in table 1. The film deposition time of each KNN film by sputtering was adjusted, so that a thickness of the KNN film was set to approximately 3 μm.

[X-Ray Diffraction Measurement of the KNN Piezoelectric Thin Film]

Figure 4:
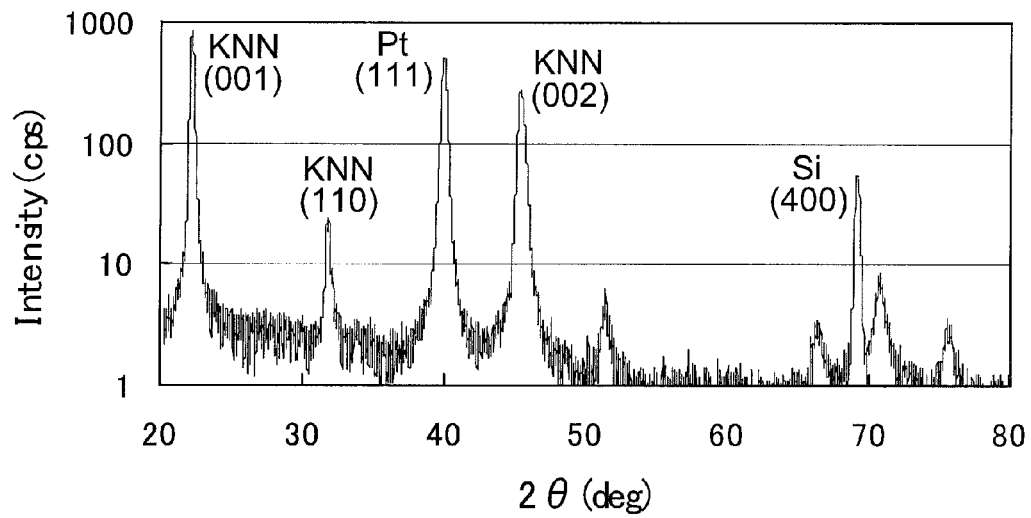
FIG. 4 is a view showing an X-ray diffraction pattern for the piezoelectric thin film element according to an example of the present invention.
Figure 5:
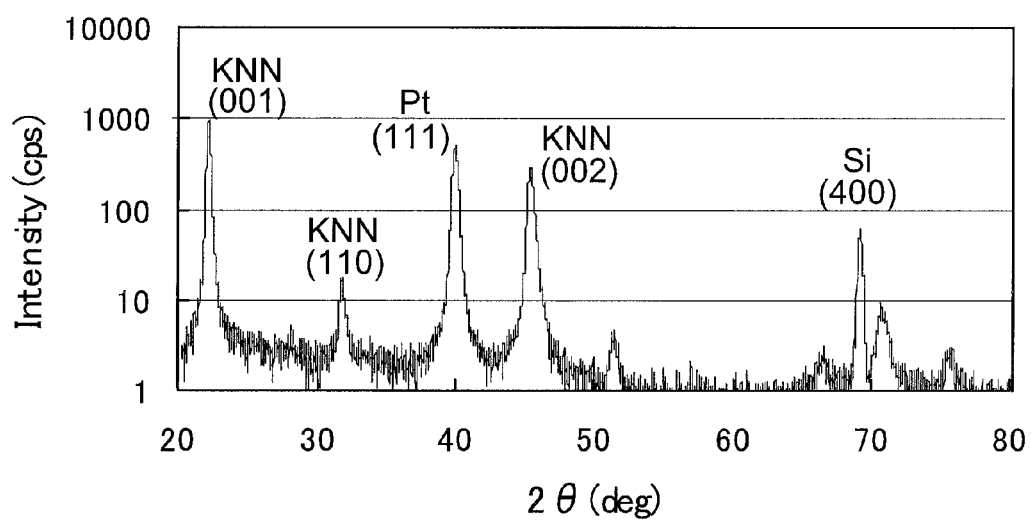
FIG. 5 is a view showing the X-ray diffraction pattern for the piezoelectric thin film element according to a comparative example of the present invention.

X-ray diffraction measurement (2θ/θ scan) was performed to the KNN piezoelectric thin films of examples 1 to 25 and comparative example 1 to 13, to thereby examine a crystal structure and an orientation state of the KNN piezoelectric thin films. As an example, an X-ray diffraction pattern of example 11 is shown in FIG. 4, and an X-ray diffraction pattern of comparative example 9 is shown in FIG. 5. It is found that each formed KNN piezoelectric thin film has a complete perovskite structure and a pseudo-cubic crystal, and is preferentially oriented to KNN (001) plane direction. Also, it is found that the Pt lower electrodes are preferentially oriented to (111) plane direction. Regarding other examples and comparative examples as well, almost the same diffraction pattern was shown, although there was a slight difference in diffraction peak angle and intensity.

[Composition Analysis of the KNN Piezoelectric Thin Film]

Composition analysis of the KNN piezoelectric thin films of examples 1 to 25 and comparative examples 1 to was performed by ICP-AES (Inductively coupled plasma-atomic emission spectrometry). The analysis was performed by using wet acids digestion and by using aqua regia and hydrofluoric acid as acids. Results of the analysis are shown in table 1. Results of calculating the ratio (K+Na)/Nb and the ratio Na/(K+Na) from the ratio of Nb, Na, and K, are also shown in table 1. By using the target with different ratio (K+Na)/Nb, it is found that the KNN piezoelectric thin film with different ratio (K+Na)/Nb was fabricated. Further, by setting the film deposition temperature to be high such as 700° C. or 800° C., the KNN piezoelectric thin film with smaller ratio (K+Na)/Nb than the target can be fabricated. Moreover, in the examples, sputter charging power density was set to 0.03 W/mm$^2$. The sputter charging power density is a value obtained by dividing a charging power to the target, by an area of a sputtering surface of the target.

[Experimental Production of an Actuator and Evaluation of Piezoelectric Characteristics]

Figure 6A:
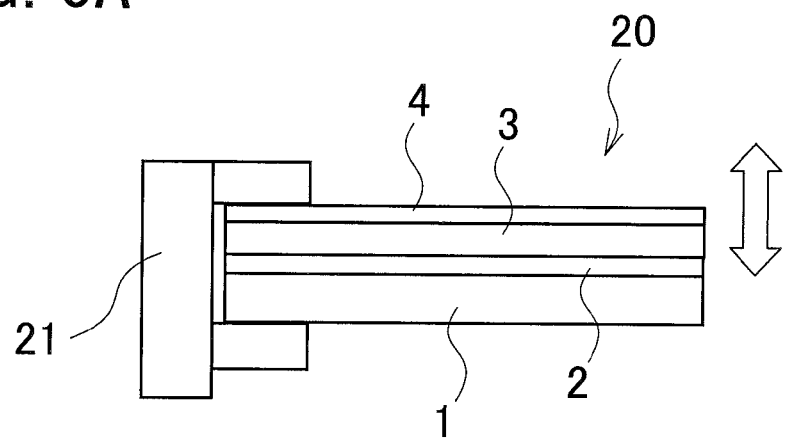
FIG. 6A is a configuration diagram showing an actuator manufactured by using the piezoelectric thin film element according to an example of the present invention.
Figure 6B:
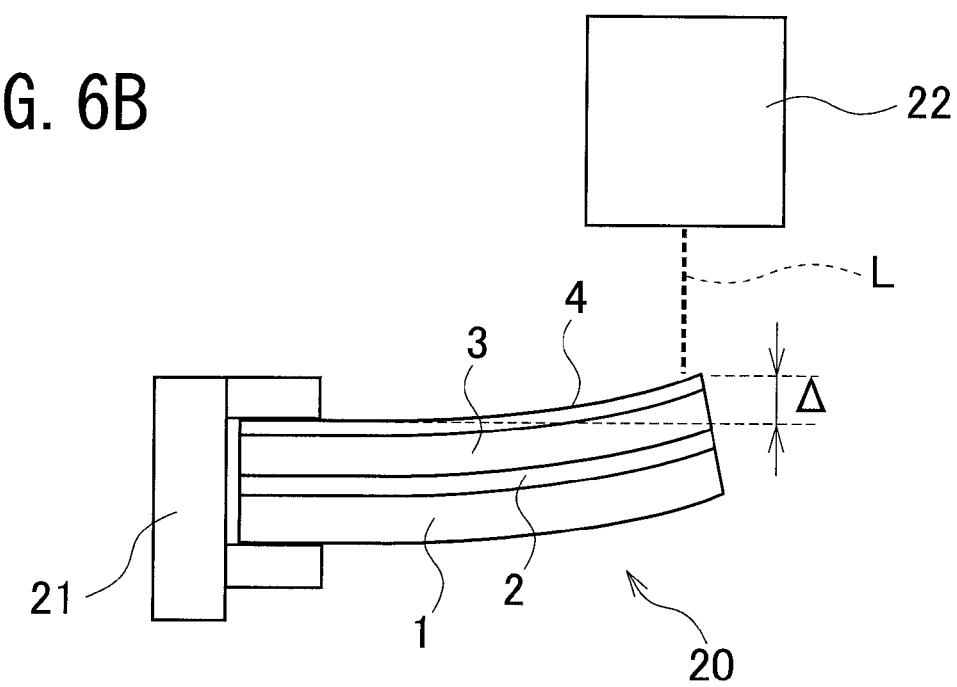
FIG. 6B is a view explaining a measurement method of the piezoelectric characteristics by the actuator of FIG. 6A.
Figure 7:
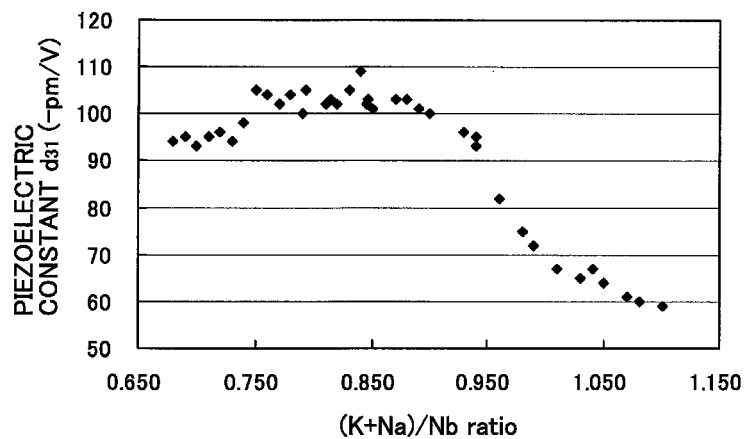
FIG. 7 is a graph showing a relation between piezoelectric constant $d_{31}$ of the piezoelectric thin film element and the ratio (K+Na)/Nb of KNN piezoelectric thin films according to examples of the present invention and comparative examples.

In order to evaluate the piezoelectric constant $d_{31}$ of the KNN piezoelectric thin film, a unimorph cantilever having a structure shown in FIG. 6A and FIG. 6B was experimentally made. First, Pt upper electrode (film thickness: 20 nm) was formed on each KNN piezoelectric thin film of the examples and the comparative examples by RF magnetron sputtering, which was then cut-out into rectangular beams (reed shape) with a length of 20 mm and a width of 2.5 mm, to thereby fabricate a piezoelectric thin film element 20 having the KNN piezoelectric thin film. Next, longitudinal one end of the piezoelectric thin film element 20 is fixed by clamp 21, to thereby fabricate a simple unimorph cantilever (FIG. 6A). Voltage is applied to the KNN piezoelectric thin film 3 between the upper electrode 4 and the lower electrode 2 of the cantilever by using a function generator not shown, and the KNN piezoelectric thin film 3 is expanded and contracted, to thereby bend and stretch an entire body of the cantilever (piezoelectric thin film element 20) and cause a tip end of the cantilever to move reciprocally in a vertical direction (in a thickness direction of the KNN piezoelectric thin film 3). Displacement amount Δ of the tip end of the cantilever at this time was measured by irradiating the tip end of the cantilever with laser light L from a laser Doppler displacement meter 21 (FIG. 6B). The piezoelectric constant $d_{31}$ can be calculated from the displacement amount Δ of the tip end of the cantilever, a length of the cantilever, a thickness and Young's modulus of the substrate 1 and the KNN piezoelectric thin film 3, and an applied voltage. The piezoelectric constant $d_{31}$ was calculated by a method described in the following non-patent document 3. The Young's modulus 104 GPa of the KNN piezoelectric thin film was used, and the piezoelectric constant $d_{31}$ with application electric field set to 50 kV/cm was measured. Results of measuring the piezoelectric constant $d_{31}$ are shown in table 1. Further, a relation between the ratio (K+Na)/Nb and the piezoelectric constant $d_{31}$ in table 1 is shown in FIG. 7.

Non-patent document 3: T. Mino, S. Kuwajima, T. Suzuki, I. Kanno, H. Kotera, and K. Wasa, Jpn. J. Appl. Phys., 46 (2007), 6960

TABLE 1

| | Composition of target (EDX) | | | Composition of KNN thin film (ICP-AES) | | | | | Characteristics of KNN thin film | |
| --- | --- | --- | --- | --- | --- | --- | --- | --- | --- | --- |
| | $\frac{(K+Na)}{Nb}$ | $\frac{Na}{(K+Na)}$ | T (° C.) | Nb | Na | K | $\frac{(K+Na)}{Nb}$ | $\frac{Na}{(K+Na)}$ | $d_{31}$ (−pm/V) | Leak current (×10$^{-7}$A/ cm$^2$) |
| Comparative example 1 | 1.27 | 0.41 | 700 | 0.48 | 0.21 | 0.31 | 1.08 | 0.40 | 60 | 0.6 |
| Example 1 | 0.97 | 0.43 | 800 | 0.55 | 0.18 | 0.27 | 0.81 | 0.40 | 102 | 0.8 |
| Example 2 | 1.07 | 0.43 | 700 | 0.52 | 0.20 | 0.28 | 0.90 | 0.42 | 100 | 0.5 |
| Comparative example 2 | 0.82 | 0.44 | 800 | 0.60 | 0.17 | 0.24 | 0.68 | 0.41 | 94 | 200 |
| Example 3 | 0.84 | 0.44 | 700 | 0.58 | 0.18 | 0.24 | 0.71 | 0.43 | 95 | 0.9 |
| Comparative example 3 | 1.12 | 0.44 | 700 | 0.51 | 0.21 | 0.28 | 0.95 | 0.43 | 83 | 0.5 |
| Example 4 | 1.04 | 0.47 | 800 | 0.53 | 0.20 | 0.26 | 0.87 | 0.44 | 103 | 0.5 |
| Comparative example 4 | 1.15 | 0.47 | 700 | 0.51 | 0.23 | 0.27 | 0.98 | 0.46 | 75 | 0.7 |
| Example 5 | 0.87 | 0.50 | 700 | 0.57 | 0.20 | 0.22 | 0.74 | 0.48 | 98 | 1.0 |
| Comparative example 5 | 1.22 | 0.52 | 650 | 0.49 | 0.25 | 0.25 | 1.04 | 0.50 | 67 | 0.5 |
| Example 6 | 0.98 | 0.53 | 700 | 0.55 | 0.23 | 0.22 | 0.83 | 0.51 | 105 | 0.8 |
| Example 7 | 0.86 | 0.55 | 800 | 0.58 | 0.22 | 0.20 | 0.72 | 0.52 | 96 | 0.7 |
| Example 8 | 0.82 | 0.56 | 700 | 0.59 | 0.22 | 0.19 | 0.70 | 0.54 | 93 | 1.0 |
| Example 9 | 0.99 | 0.58 | 700 | 0.54 | 0.26 | 0.20 | 0.84 | 0.56 | 109 | 0.8 |
| Comparative example 6 | 1.24 | 0.59 | 700 | 0.49 | 0.29 | 0.22 | 1.05 | 0.57 | 64 | 0.5 |
| Example 10 | 1.09 | 0.60 | 700 | 0.52 | 0.28 | 0.20 | 0.93 | 0.58 | 96 | 0.6 |
| Comparative example 7 | 1.26 | 0.61 | 700 | 0.48 | 0.30 | 0.21 | 1.07 | 0.59 | 61 | 0.4 |
| Example 11 | 0.92 | 0.62 | 700 | 0.56 | 0.26 | 0.18 | 0.78 | 0.60 | 104 | 0.7 |
| Example 12 | 0.91 | 0.64 | 800 | 0.57 | 0.26 | 0.17 | 0.76 | 0.60 | 104 | 0.6 |

TABLE 1-continued

| | Composition of target (EDX) | | | Composition of KNN thin film (ICP-AES) | | | | | Characteristics of KNN thin film | |
|---|---|---|---|---|---|---|---|---|---|---|
| | $\frac{(K+Na)}{Nb}$ | $\frac{Na}{(K+Na)}$ | T (°C.) | Nb | Na | K | $\frac{(K+Na)}{Nb}$ | $\frac{Na}{(K+Na)}$ | $d_{31}$ (−pm/V) | Leak current (×10$^{-7}$ A/cm$^2$) |
| Example 13 | 0.86 | 0.64 | 700 | 0.58 | 0.26 | 0.16 | 0.73 | 0.62 | 94 | 0.9 |
| Example 14 | 0.96 | 0.65 | 700 | 0.55 | 0.28 | 0.17 | 0.81 | 0.63 | 103 | 0.7 |
| Example 15 | 1.06 | 0.65 | 800 | 0.53 | 0.29 | 0.18 | 0.88 | 0.61 | 103 | 0.5 |
| Comparative example 8 | 1.24 | 0.65 | 800 | 0.49 | 0.31 | 0.20 | 1.03 | 0.61 | 65 | 0.7 |
| Comparative example 9 | 0.81 | 0.65 | 650 | 0.59 | 0.26 | 0.15 | 0.69 | 0.63 | 95 | 100 |
| Example 16 | 0.68 | 0.65 | 700 | 0.57 | 0.27 | 0.16 | 0.75 | 0.63 | 105 | 0.4 |
| Example 17 | 1.02 | 0.67 | 800 | 0.54 | 0.29 | 0.17 | 0.85 | 0.63 | 103 | 0.7 |
| Comparative example 10 | 1.19 | 0.67 | 800 | 0.50 | 0.31 | 0.18 | 0.99 | 0.63 | 72 | 0.5 |
| Example 18 | 0.89 | 0.67 | 700 | 0.54 | 0.30 | 0.16 | 0.85 | 0.65 | 102 | 0.6 |
| Example 19 | 0.85 | 0.67 | 800 | 0.56 | 0.28 | 0.16 | 0.79 | 0.63 | 105 | 0.5 |
| Comparative example 11 | 1.28 | 0.68 | 700 | 0.48 | 0.34 | 0.18 | 1.10 | 0.66 | 59 | 0.7 |
| Example 20 | 1.07 | 0.69 | 800 | 0.53 | 0.31 | 0.16 | 0.89 | 0.65 | 101 | 0.4 |
| Comparative example 12 | 1.18 | 0.69 | 700 | 0.50 | 0.34 | 0.17 | 1.01 | 0.67 | 67 | 0.6 |
| Example 21 | 0.91 | 0.71 | 700 | 0.56 | 0.30 | 0.13 | 0.77 | 0.69 | 102 | 0.6 |
| Example 22 | 0.93 | 0.71 | 700 | 0.56 | 0.30 | 0.14 | 0.79 | 0.70 | 100 | 0.5 |
| Example 23 | 0.96 | 0.71 | 700 | 0.55 | 0.31 | 0.14 | 0.82 | 0.69 | 102 | 0.7 |
| Example 24 | 1.11 | 0.72 | 700 | 0.52 | 0.34 | 0.15 | 0.94 | 0.70 | 93 | 0.4 |
| Comparative example 13 | 1.13 | 0.72 | 700 | 0.51 | 0.34 | 0.15 | 0.96 | 0.70 | 92 | 0.6 |
| Example 25 | 1.02 | 0.72 | 800 | 0.54 | 0.31 | 0.15 | 0.85 | 0.68 | 101 | 0.6 |

T expresses "Film deposition temperature".

Further, current-voltage characteristics and insulating performance were examined by measuring the leak current when the voltage was applied between the upper electrode 4 and the lower electrode 2. An indication of right and wrong of the insulating performance was judged by the value of the leak current that flows when the electric field of 50 kV/cm was applied to the KNN piezoelectric thin film. Generally, the insulating performance is judged to have no problem when the leak current is $1 \times 10^{-7}$ (A/cm$^2$) or less. Measurement results of the leak current are shown in table 1. Further, a relation between the ratio (K+Na)/Nb and the leak current in table 1 is shown in FIG. 8.

From the table 1 and FIG. 7, it was found that when the Na/(K+Na) composition of the KNN piezoelectric thin film was in a range of $0.4 \leq x \leq 0.7$, high piezoelectric constant $d_{31}$, being a practical level of −90 pm/V or more could be obtained in a range of $0.70 \leq y \leq 0.94$. Also, it was found that in a case of a range of $0.75 \leq y \leq 0.90$, the piezoelectric constant $d_{31}$ of a practical level of further higher −100 pm/V ore more could be obtained. Further, from the table 1 and FIG. 8, it was found that in a case of a range of y<0.7, utilization as the piezoelectric thin film element was difficult, because the insulating performance of the KNN piezoelectric thin film was remarkably deteriorated.

From these results, it is found that in order to realize a piezoelectric thin film having a high piezoelectric constant and a low leak current, the range of $0.70 \leq y \leq 0.94$ or further preferably the range of $0.75 \leq y \leq 0.90$ is optimal, when x is in a range of $0.4 \leq x \leq 0.7$.

What is claimed is:

1. A piezoelectric thin film element, comprising:
   a piezoelectric thin film on a substrate, having an alkali-niobium oxide-based perovskite structure expressed by a composition formula $(K_{1-x}Na_x)_yNbO_3$,
   wherein composition ratios x, y of the piezoelectric thin film expressed by $(K_{1-x}Na_x)_yNbO_3$ are in a range of $0.4 \leq x \leq 0.7$ and $0.7 \leq y \leq 0.94$.

2. The piezoelectric thin film element according to claim 1, wherein the piezoelectric thin film has a pseudo-cubic crystal structure and is preferentially oriented to (001) plane direction.

3. The piezoelectric thin film element according to claim 1, comprising a lower electrode at the substrate side of the piezoelectric thin film, and an upper electrode at the opposite side to the substrate of the piezoelectric thin film.

4. The piezoelectric thin film element according to claim 3, wherein the lower electrode is made of platinum, and is preferentially oriented to (111) plane direction.

5. A piezoelectric thin film device, comprising:
   the piezoelectric thin film element described in claim 3;
   a voltage application unit or a voltage detection unit connected between the lower electrode and the upper electrode of the piezoelectric thin film element.

6. The piezoelectric thin film element according to claim 1, wherein the substrate is Si substrate, Si substrate with a surface oxide film, or SOI substrate.

7. A piezoelectric thin film element, comprising:
   a piezoelectric thin film on a substrate, having an alkali-niobium oxide-based perovskite structure expressed by a composition formula $(K_{1-x}Na_x)_yNbO_3$,
   wherein composition ratios x, y of the piezoelectric thin film expressed by $(K_{1-x}Na_x)_yNbO_3$ are in a range of $0.4 \leq x \leq 0.7$ and $0.75 \leq y \leq 0.90$.

8. The piezoelectric thin film element according to claim 7, wherein the piezoelectric thin film has a pseudo-cubic crystal structure and is preferentially oriented to (001) plane direction.

9. The piezoelectric thin film element according to claim 7, comprising; a lower electrode at the substrate side of the piezoelectric thin film, and an upper electrode at the opposite side to the substrate of the piezoelectric thin film.

10. The piezoelectric thin film element according to claim 9, wherein the lower electrode is made of platinum, and is preferentially oriented to (111) plane direction.

11. A piezoelectric thin film device, comprising:
the piezoelectric thin film element described in claim 9;
a voltage application unit or a voltage detection unit connected between the lower electrode and the upper electrode of the piezoelectric thin film element.

12. The piezoelectric thin film element according to claim 7, wherein the substrate is Si substrate, Si substrate with a surface oxide film, or SOI substrate.

* * * * *